United States Patent
Wang et al.

(10) Patent No.: US 10,804,441 B2
(45) Date of Patent: Oct. 13, 2020

(54) LIGHT-EMITTING DEVICE WITH YELLOW COLOR FILTERS

(71) Applicant: VisEra Technologies Company Limited, Hsin-Chu (TW)

(72) Inventors: Wei-Ko Wang, Taoyuan (TW); Chia-Hui Wu, Lunbei Township, Yunlin County (TW)

(73) Assignee: Visera Technologies Company Limited, Hsin-Chu (TW)

( * ) Notice: Subject to any disclaimer, the term of this patent is extended or adjusted under 35 U.S.C. 154(b) by 0 days.

(21) Appl. No.: 16/176,970

(22) Filed: Oct. 31, 2018

(65) Prior Publication Data
US 2020/0135985 A1    Apr. 30, 2020

(51) Int. Cl.
*H01L 33/50* (2010.01)
*H01L 27/15* (2006.01)

(52) U.S. Cl.
CPC .......... *H01L 33/504* (2013.01); *H01L 27/156* (2013.01); *H01L 2933/0041* (2013.01)

(58) Field of Classification Search
CPC .................. H01L 33/504; H01L 27/156; H01L 2933/0041; H01L 33/507; H01L 33/44; H01L 25/0753
See application file for complete search history.

(56) References Cited

U.S. PATENT DOCUMENTS

| | | | |
|---|---|---|---|
| 2014/0367633 A1* | 12/2014 | Bibl .................. | G02F 1/133603 257/13 |
| 2016/0216555 A1* | 7/2016 | Kim .................. | G02F 1/133514 |
| 2016/0218150 A1 | 7/2016 | Hack et al. | |

(Continued)

FOREIGN PATENT DOCUMENTS

| CN | 108681145 A | 10/2018 |
|---|---|---|
| EP | 3339920 A1 | 6/2018 |

(Continued)

OTHER PUBLICATIONS

Office Action of corresponding application TW108116769, dated Dec. 4, 2019, 14 pages.

(Continued)

*Primary Examiner* — Quoc D Hoang
(74) *Attorney, Agent, or Firm* — Muncy, Geissler, Olds & Lowe, P.C.

(57) ABSTRACT

A light-emitting device is provided. The light-emitting device includes a substrate including a plurality of pixels, each pixel including a plurality of subpixels designed to emit light with different colors. The plurality of subpixels includes a first subpixel designed to emit red light, a second subpixel designed to emit green light, and a third subpixel designed to emit blue light. The first subpixel includes a first light source formed on the substrate, a red light-emitting layer covering the first light source, and a first yellow color filter covering the red light-emitting layer. The second subpixel includes a second light source formed on the substrate, a green light-emitting layer covering the second light source, and a second yellow color filter covering the green light-emitting layer. The third subpixel includes a third light source formed on the substrate. A method for fabricating the light-emitting device is also provided.

16 Claims, 6 Drawing Sheets

(56) References Cited

U.S. PATENT DOCUMENTS

2018/0157086 A1* 6/2018 Cho .................. G02F 1/133536
2018/0190625 A1 7/2018 Steckel et al.

FOREIGN PATENT DOCUMENTS

| JP | 2000131683 A | 5/2000 |
| JP | 2016037483 A | 3/2016 |
| JP | 2016058586 A | 4/2016 |
| JP | 2016523450 A | 8/2016 |
| JP | 2017076769 A | 4/2017 |
| TW | 201507212 A | 2/2015 |

OTHER PUBLICATIONS

Office Action of corresponding JP Application No. 2019044679, dated Mar. 24, 2020, 3 pages.
Office Action dated Jul. 8, 2020 in JP Application No. 2019-044679 (w/English-language translation).

* cited by examiner

LIGHT-EMITTING DEVICE WITH YELLOW COLOR FILTERS

BACKGROUND OF THE INVENTION

Field of the Invention

The invention relates to a light-emitting device, and more particularly to a light-emitting device with yellow color filters covering a red light-emitting layer and a green light-emitting layer, and a method for fabricating the same.

Description of the Related Art

Micro-LED (also known as mLED or µLED) is a display technology that is based on tiny (hence, micro) LED devices that are used to directly create color pixels. Micro-LED displays have the potential to create highly efficient and great-looking flexible displays, to challenge the current market dominance of high-end OLED displays.

An ideal case is to have R/G/B LED on a substrate. But it is difficult to mass produce. Many companies try to have an alternative solution. One is disposing only deep-blue (DB) or blue (B) chips on a substrate. However, for the wavelength conversion layer (e.g. including phosphor or quantum dot), it's difficult to have a pure color transformation from DB or B. Some noise will exist, e.g. green light mixed with a little blue light or red light mixed with a little blue light.

Therefore, development of a light-emitting device (ex. Micro-LED) capable of blocking deep-blue-light and blue-light noise is desirable.

BRIEF SUMMARY OF THE INVENTION

In accordance with one embodiment of the invention, a light-emitting device is provided. The light-emitting device includes a substrate including a plurality of pixels, each pixel including a plurality of subpixels designed to emit light with different colors. The plurality of subpixels includes a first subpixel designed to emit red light, a second subpixel designed to emit green light, and a third subpixel designed to emit blue light. The first subpixel includes a first light source formed on the substrate, a red light-emitting layer covering the first light source, and a first yellow color filter covering the red light-emitting layer. The second subpixel includes a second light source formed on the substrate, a green light-emitting layer covering the second light source, and a second yellow color filter covering the green light-emitting layer. The third subpixel includes a third light source formed on the substrate.

In some embodiments, the first light source, the second light source and the third light source emit deep blue (DB) light. In some embodiments, the first light source, the second light source and the third light source emit blue (B) light. In some embodiments, the red light-emitting layer includes red phosphor. In some embodiments, the green light-emitting layer includes green phosphor.

In some embodiments, the first yellow color filter and the second yellow color filter include yellow pigments blended in a polymer matrix. In some embodiments, the first yellow color filter and the second yellow color filter have a thickness which is in a range from 0.8 µm to 2.0 µm. In some embodiments, the first yellow color filter and the second yellow color filter have a light transmittance rate which is less than 1% for light with a wavelength of 400 nm to 480 nm. In some embodiments, the first yellow color filter and the second yellow color filter have a light transmittance rate which is greater than 80% for light with a wavelength of 550 nm or above. In some embodiments, the first yellow color filter and the second yellow color filter have a light transmittance rate which is equal to 50% for light with a wavelength of 490 nm to 530 nm. In some embodiments, the first yellow color filter and the second yellow color filter have curved structures or polygonal structures in a cross-section perpendicular to the substrate.

In some embodiments, when each of the first light source, the second light source and the third light source emits deep blue (DB) light, the light-emitting device further includes a blue light-emitting layer covering the third light source. In some embodiments, the blue light-emitting layer includes blue phosphor.

In some embodiments, when each of the first light source, the second light source and the third light source emits deep blue (DB) light, the light-emitting device further includes a first light guiding layer formed between the first light source and the red light-emitting layer, a second light guiding layer formed between the second light source and the green light-emitting layer, and a third light guiding layer formed between the third light source and the blue light-emitting layer. In some embodiments, when each of the first light source, the second light source and the third light source emits blue (B) light, the light-emitting device further includes a first light guiding layer formed between the first light source and the red light-emitting layer, a second light guiding layer formed between the second light source and the green light-emitting layer, and a third light guiding layer covering the third light source.

In some embodiments, the first light source constitutes a first micro LED device, the second light source constitutes a second micro LED device, and the third light source constitutes a third micro LED device. In some embodiments, each of the first micro LED device, the second micro LED device and the third micro LED device has a width which is in a range from 1 µm to 100 µm.

In accordance with one embodiment of the invention, a method for fabricating a light-emitting device is provided. The fabrication method includes the following steps. A substrate with a first light source, a second light source and a third light source mounted thereon is provided. The second light source is located between the first light source and the third light source. The first light source is covered by a red light-emitting layer. The second light source is covered by a green light-emitting layer. A yellow color filter layer is formed over the substrate. A lithography process is performed on the yellow color filter layer to form a first yellow color filter and a second yellow color filter. The first yellow color filter covers the red light-emitting layer. The second yellow color filter covers the green light-emitting layer.

In some embodiments, the step of forming a yellow color filter layer over the substrate is performed by a spin-coating or spray-coating process.

In the present invention, yellow color filters having specific optical properties disposed to cover the red light-emitting layer and the green light-emitting layer are able to fully block the noise of deep-blue light and blue light emitted by the light sources and allow red light and green light to pass through. By disposing the yellow color filters with a specific range of light transmittance rate, the purity of light emitted by the red subpixels and the green subpixels is thus improved. In addition, the yellow color filters comprise curved structures, polygonal structures or other structures with suitable shapes. The specific dimensions of the yellow color filters are also required. For example, the thickness of the yellow color filters is in a range from about 0.8 µm to about 2.0 µm to ensure that the yellow color filters achieve adequate light interception efficiency.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
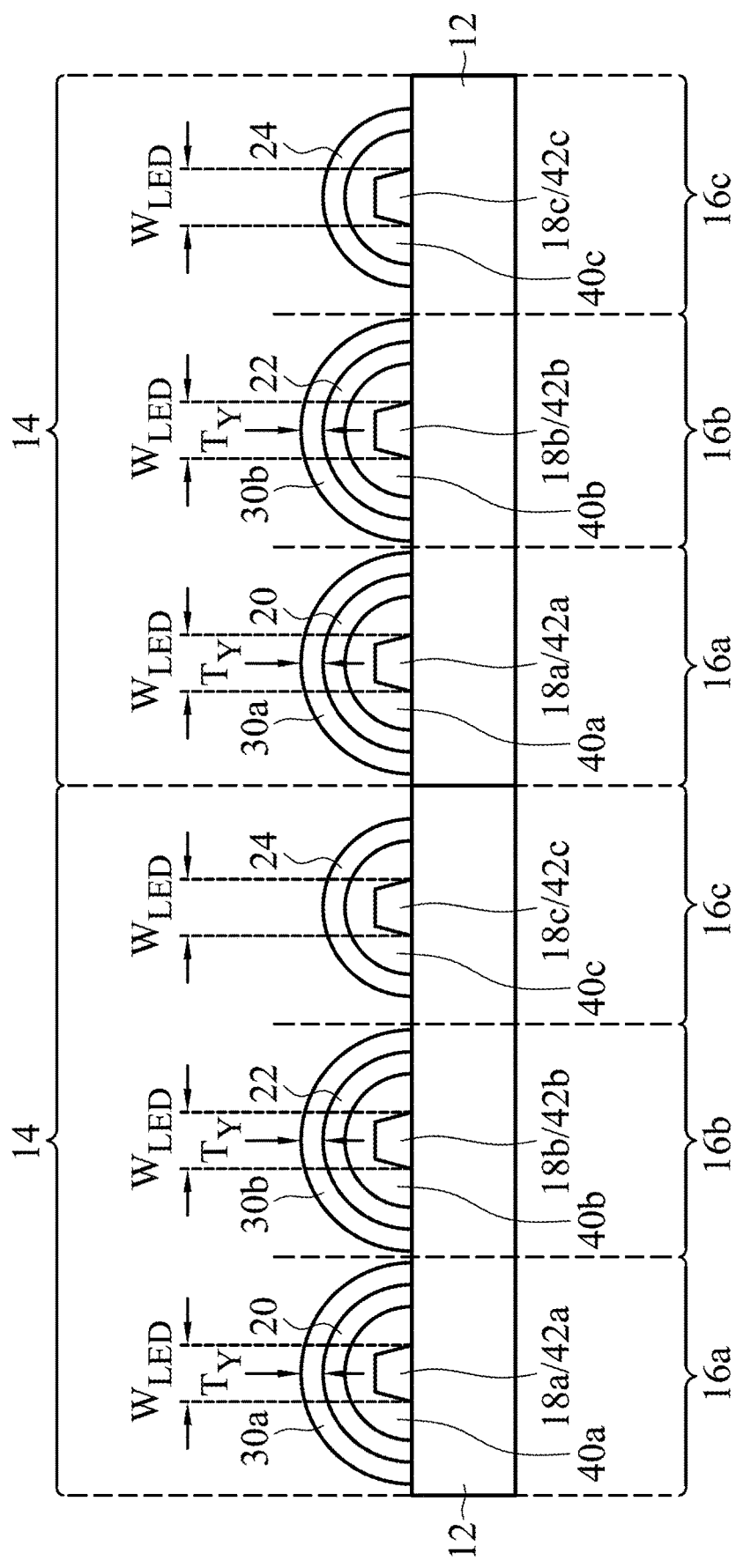
FIG. 1 is a cross-sectional view of a light-emitting device in accordance with one embodiment of the invention.

Referring to FIG. 1, in accordance with one embodiment of the invention, a light-emitting device 10 is provided. FIG. 1 shows a cross-sectional view of the light-emitting device 10.

The light-emitting device 10 includes a substrate 12 including a plurality of pixels 14, each pixel 14 including a plurality of subpixels (16a, 16b and 16c) designed to emit light with different colors. The plurality of subpixels (16a, 16b and 16c) includes a first subpixel 16a designed to emit red light (R), a second subpixel 16b designed to emit green light (G), and a third subpixel 16c designed to emit blue light (B). The first subpixel 16a includes a first light source 18a, a red light-emitting layer 20 and a first yellow color filter 30a. The first light source 18a is formed on the substrate 12. The red light-emitting layer 20 covers the first light source 18a. The first yellow color filter 30a covers the red light-emitting layer 20. The second subpixel 16b includes a second light source 18b, a green light-emitting layer 22 and a second yellow color filter 30b. The second light source 18b is formed on the substrate 12. The green light-emitting layer 22 covers the second light source 18b. The second yellow color filter 30b covers the green light-emitting layer 22. The third subpixel 16c includes a third light source 18c formed on the substrate 12.

In FIG. 1, each of the first light source 18a, the second light source 18b and the third light source 18c emits deep blue (DB) light (e.g. 420 nm-450 nm). In some embodiments, the red light-emitting layer 20 includes red phosphor. In some embodiments, the green light-emitting layer 22 includes green phosphor. Examples of phosphor materials include sulfides, aluminates, oxides, silicates, nitrides, YAG (optionally doped with cerium), and terbium aluminum garnet (TAG)-based materials. The red light-emitting layer 20 including red phosphor absorbs the deep blue (DB) emission from the first light source 18a and converts the emission wavelength to red light. The green light-emitting layer 22 including green phosphor absorbs the deep blue (DB) emission from the second light source 18b and converts the emission wavelength to green light.

In some embodiments, the first yellow color filter 30a and the second yellow color filter 30b include yellow pigments blended in a polymer matrix. In some embodiments, the first yellow color filter 30a and the second yellow color filter 30b have a thickness "$T_y$," which is in a range from about 0.8 µm to about 2.0 µm. In some embodiments, the first yellow color filter 30a and the second yellow color filter 30b have a light transmittance rate which is less than about 1% for light with a wavelength of 400 nm to 480 nm. In some embodiments, the first yellow color filter 30a and the second yellow color filter 30b have a light transmittance rate which is greater than about 80% for light with a wavelength of 550 nm or above. In some embodiments, the first yellow color filter 30a and the second yellow color filter 30b have a light transmittance rate which is equal to about 50% for light with a wavelength of 490 nm to 530 nm. The light transmittance rate of the first yellow color filter 30a and the second yellow color filter 30b can be optimized by adjusting the amount of yellow pigment in the polymer matrix. In FIG. 1, the first yellow color filter 30a and the second yellow color filter 30b have curved structures. In detail, the first yellow color filter 30a and the second yellow color filter 30b have curved structures in a cross-section perpendicular to the substrate 12.

In some embodiments, the red light (e.g. 610 nm-780 nm) emitted by the red light-emitting layer 20 will be mixed with a part of the deep blue (DB) light (e.g. 420 nm-450 nm) emitted by the first light source 18a. However, the part of the deep blue (DB) light will be fully blocked and all of the red light will be allowed to pass through by the first yellow color filter 30a covering the red light-emitting layer 20 due to the first yellow color filter 30a having specific optical properties, wherein its light transmittance rate is less than about 1% for light with a wavelength of 400 nm to 480 nm and its light transmittance rate is greater than about 80% for light with a wavelength of 550 nm or above. Similarly, the green light (e.g. 500 nm-550 nm) emitted by the green light-emitting layer 22 will be mixed with a part of the deep blue (DB) light (e.g. 420 nm-450 nm) emitted by the second light source 18b. Also, the part of the deep blue (DB) light will be fully blocked and most of the green light will be allowed to pass through by the second yellow color filter 30b covering the green light-emitting layer 22 due to the second yellow color filter 30b having specific optical properties, wherein its light transmittance rate is less than about 1% for light with a wavelength of 400 nm to 480 nm and its light transmittance rate is equal to about 50% for light with a wavelength of 490 nm to 530 nm. Therefore, in the first subpixel 16a, unwanted deep-blue-light noise will be fully blocked and pure red light will be emitted therefrom. Also, in the second subpixel 16b, unwanted deep-blue-light noise will be fully blocked and pure green light will be emitted therefrom.

In FIG. 1, the light-emitting device 10 further includes a blue light-emitting layer 24 which covers the third light source 18c. In some embodiments, the blue light-emitting layer 24 includes blue phosphor. Examples of phosphor materials include sulfides, aluminates, oxides, silicates, nitrides, YAG (optionally doped with cerium), and terbium aluminum garnet (TAG)-based materials. The blue light-emitting layer 24 including blue phosphor absorbs the deep blue (DB) emission from the third light source 18c and converts the emission wavelength to blue light.

In FIG. 1, the light-emitting device 10 further includes a first light guiding layer 40a, a second light guiding layer 40b and a third light guiding layer 40c. The first light guiding layer 40a is formed between the first light source 18a and the red light-emitting layer 20. The second light guiding layer 40b is formed between the second light source 18b and the green light-emitting layer 22. The third light guiding layer 40c is formed between the third light source 18c and the blue light-emitting layer 24. The first light guiding layer 40a allows refraction of incident light from the first light source 18a out of the first light guiding layer 40a and towards the red light-emitting layer 20, and to cause internal reflection and lateral spreading of incident light from the first light source 18a within the first light guiding layer 40a. Similarly, the second light guiding layer 40b allows refraction of incident light from the second light source 18b out of the second light guiding layer 40b and towards the green light-emitting layer 22, and to cause internal reflection and lateral spreading of incident light from the second light source 18b within the second light guiding layer 40b. Similarly, the third light guiding layer 40c allows refraction of incident light from the third light source 18c out of the third light guiding layer 40c and towards the blue light-emitting layer 24, and to cause internal reflection and lateral spreading of incident light from the third light source 18c within the third light guiding layer 40c. In some embodiments, the first light guiding layer 40a, the second light guiding layer 40b and the third light guiding layer 40c are formed of a variety of transparent materials such as epoxy, silicone or acrylic.

In some embodiments, the first light source 18a constitutes a first micro LED device 42a. The second light source 18b constitutes a second micro LED device 42b. The third light source 18c constitutes a third micro LED device 42c. In some embodiments, each of the first micro LED device 42a, the second micro LED device 42b and the third micro LED device 42c has a width "$W_{LED}$" which is in a range from about 1 µm to about 100 µm.

Figure 2:
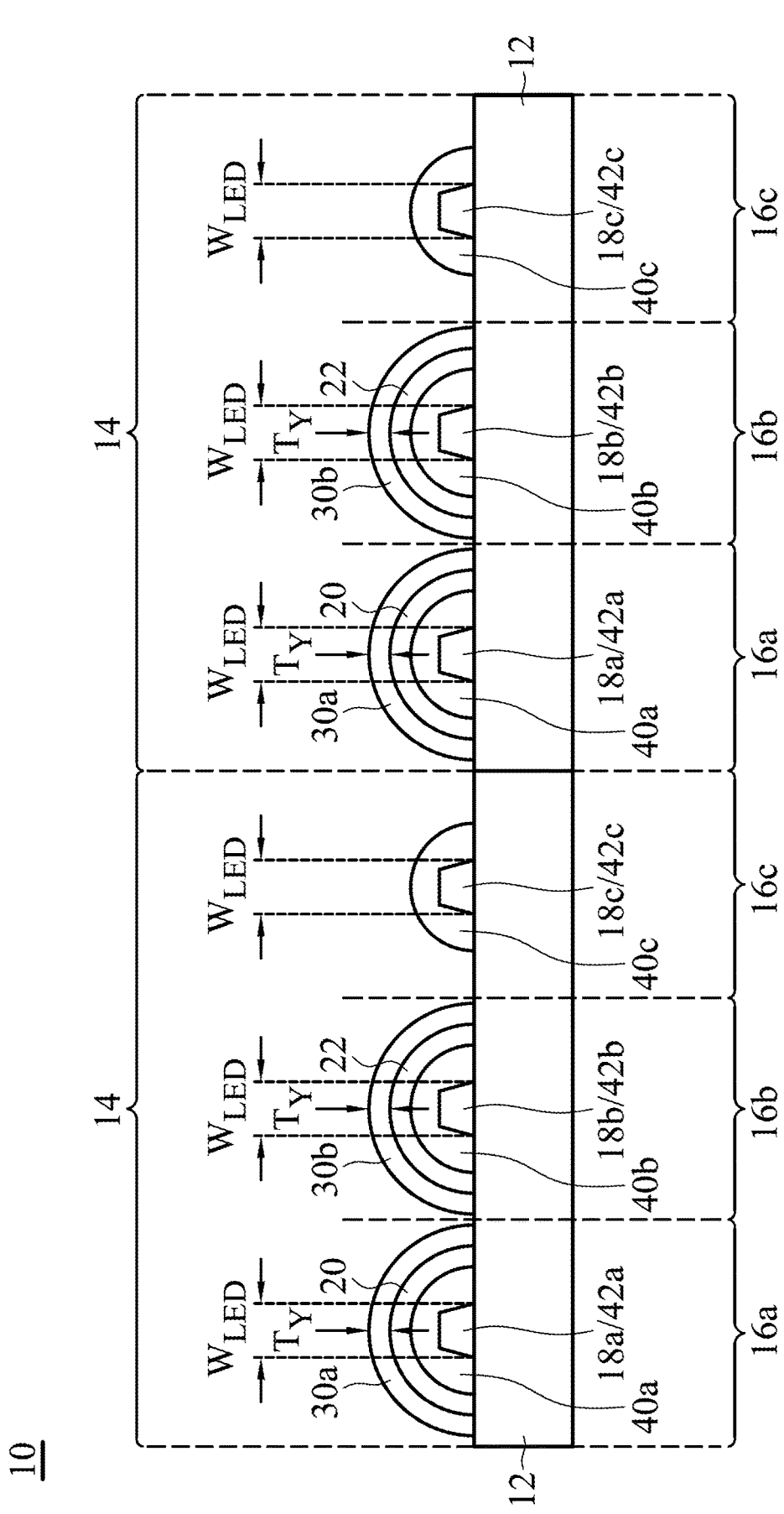
FIG. 2 is a cross-sectional view of a light-emitting device in accordance with one embodiment of the invention.

Referring to FIG. 2, in accordance with one embodiment of the invention, a light-emitting device 10 is provided. FIG. 2 shows a cross-sectional view of the light-emitting device 10.

The light-emitting device 10 includes a substrate 12 including a plurality of pixels 14, each pixel 14 including a plurality of subpixels (16a, 16b and 16c) designed to emit light with different colors. The plurality of subpixels (16a, 16b and 16c) includes a first subpixel 16a designed to emit red light (R), a second subpixel 16b designed to emit green light (G), and a third subpixel 16c designed to emit blue light (B). The first subpixel 16a includes a first light source 18a, a red light-emitting layer 20 and a first yellow color filter 30a. The first light source 18a is formed on the substrate 12. The red light-emitting layer 20 covers the first light source 18a. The first yellow color filter 30a covers the red light-emitting layer 20. The second subpixel 16b includes a second light source 18b, a green light-emitting layer 22 and a second yellow color filter 30b. The second light source 18b is formed on the substrate 12. The green light-emitting layer 22 covers the second light source 18b. The second yellow color filter 30b covers the green light-emitting layer 22. The third subpixel 16c includes a third light source 18c formed on the substrate 12.

In FIG. 2, each of the first light source 18a, the second light source 18b and the third light source 18c emits blue (B) light (e.g. 450 nm-485 nm). In some embodiments, the red light-emitting layer 20 includes red phosphor. In some embodiments, the green light-emitting layer 22 includes green phosphor. Examples of phosphor materials include sulfides, aluminates, oxides, silicates, nitrides, YAG (optionally doped with cerium), and terbium aluminum garnet (TAG)-based materials. The red light-emitting layer 20 including red phosphor absorbs the blue (B) emission from the first light source 18a and converts the emission wavelength to red light. The green light-emitting layer 22 including green phosphor absorbs the blue (B) emission from the second light source 18b and converts the emission wavelength to green light.

In some embodiments, the first yellow color filter 30a and the second yellow color filter 30b include yellow pigments blended in a polymer matrix. In some embodiments, the first yellow color filter 30a and the second yellow color filter 30b have a thickness "$T_Y$" which is in a range from about 0.8 µm to about 2.0 µm. In some embodiments, the first yellow color filter 30a and the second yellow color filter 30b have a light transmittance rate which is less than about 1% for light with a wavelength of 400 nm to 480 nm. In some embodiments, the first yellow color filter 30a and the second yellow color filter 30b have a light transmittance rate which is greater than about 80% for light with a wavelength of 550 nm or above. In some embodiments, the first yellow color filter 30a and the second yellow color filter 30b have a light transmittance rate which is equal to about 50% for light with a wavelength of 490 nm to 530 nm. The light transmittance rate of the first yellow color filter 30a and the second yellow color filter 30b can be optimized by adjusting the amount of yellow pigment in the polymer matrix. In FIG. 2, the first yellow color filter 30a and the second yellow color filter 30b have curved structures. In detail, the first yellow color filter 30a and the second yellow color filter 30b have curved structures in a cross-section perpendicular to the substrate 12.

In some embodiments, the red light (e.g. 610 nm-780 nm) emitted by the red light-emitting layer 20 will be mixed with a part of the blue (B) light (e.g. 450 nm-485 nm) emitted by the first light source 18a. However, the part of the blue (B) light will be fully blocked and all of the red light will be allowed to pass through by the first yellow color filter 30a covering the red light-emitting layer 20 due to the first yellow color filter 30a having specific optical properties, wherein its light transmittance rate is less than about 1% for light with a wavelength of 400 nm to 480 nm and its light transmittance rate is greater than about 80% for light with a wavelength of 550 nm or above. Similarly, the green light (e.g. 500 nm-550 nm) emitted by the green light-emitting layer 22 will be mixed with a part of the blue (B) light (e.g. 450 nm-485 nm) emitted by the second light source 18b. Also, the part of the blue (B) light will be fully blocked and most of the green light will be allowed to pass through by the second yellow color filter 30b covering the green light-emitting layer 22 due to the second yellow color filter 30b having specific optical properties, wherein its light transmittance rate is less than about 1% for light with a wavelength of 400 nm to 480 nm and its light transmittance rate is equal to about 50% for light with a wavelength of 490 nm to 530 nm. Therefore, in the first subpixel 16a, unwanted blue-light noise will be fully blocked and pure red light will be emitted therefrom. Also, in the second subpixel 16b, unwanted blue-light noise will be fully blocked and pure green light will be emitted therefrom.

In FIG. 2, the light-emitting device 10 further includes a first light guiding layer 40a, a second light guiding layer 40b and a third light guiding layer 40c. The first light guiding layer 40a is formed between the first light source 18a and the red light-emitting layer 20. The second light guiding layer 40b is formed between the second light source 18b and the green light-emitting layer 22. The third light guiding layer 40c covers the third light source 18c. In some embodiments, the first light guiding layer 40a, the second light guiding layer 40b and the third light guiding layer 40c are formed of a variety of transparent materials such as epoxy, silicone or acrylic.

In some embodiments, the first light source 18a constitutes a first micro LED device 42a. The second light source 18b constitutes a second micro LED device 42b. The third light source 18c constitutes a third micro LED device 42c. In some embodiments, each of the first micro LED device 42a, the second micro LED device 42b and the third micro LED device 42c has a width "$W_{LED}$" which is in a range from about 1 μm to about 100 μm.

Figure 3:
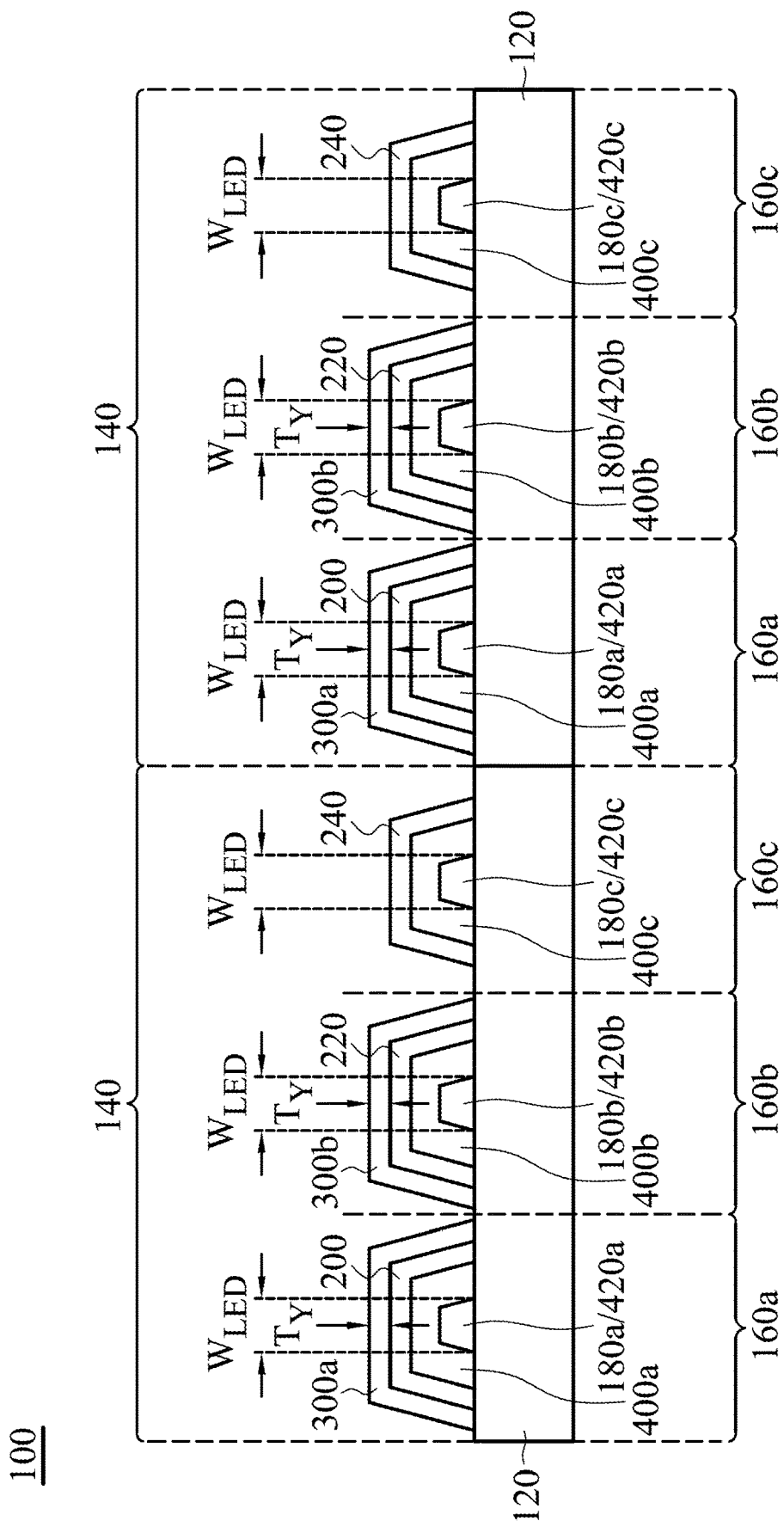
FIG. 3 is a cross-sectional view of a light-emitting device in accordance with one embodiment of the invention.

Referring to FIG. 3, in accordance with one embodiment of the invention, a light-emitting device 100 is provided. FIG. 3 shows a cross-sectional view of the light-emitting device 100.

The light-emitting device 100 includes a substrate 120 including a plurality of pixels 140, each pixel 140 including a plurality of subpixels (160a, 160b and 160c) designed to emit light with different colors. The plurality of subpixels (160a, 160b and 160c) includes a first subpixel 160a designed to emit red light (R), a second subpixel 160b designed to emit green light (G), and a third subpixel 160c designed to emit blue light (B). The first subpixel 160a includes a first light source 180a, a red light-emitting layer 200 and a first yellow color filter 300a. The first light source 180a is formed on the substrate 120. The red light-emitting layer 200 covers the first light source 180a. The first yellow color filter 300a covers the red light-emitting layer 200. The second subpixel 160b includes a second light source 180b, a green light-emitting layer 220 and a second yellow color filter 300b. The second light source 180b is formed on the substrate 120. The green light-emitting layer 220 covers the second light source 180b. The second yellow color filter 300b covers the green light-emitting layer 220. The third subpixel 160c includes a third light source 180c formed on the substrate 120.

In FIG. 3, each of the first light source 180a, the second light source 180b and the third light source 180c emits deep blue (DB) light (e.g. 420 nm-450 nm). In some embodiments, the red light-emitting layer 200 includes red phosphor. In some embodiments, the green light-emitting layer 220 includes green phosphor. Examples of phosphor materials include sulfides, aluminates, oxides, silicates, nitrides, YAG (optionally doped with cerium), and terbium aluminum garnet (TAG)-based materials. The red light-emitting layer 200 including red phosphor absorbs the deep blue (DB) emission from the first light source 180a and converts the emission wavelength to red light. The green light-emitting layer 220 including green phosphor absorbs the deep blue (DB) emission from the second light source 180b and converts the emission wavelength to green light.

In some embodiments, the first yellow color filter 300a and the second yellow color filter 300b include yellow pigments blended in a polymer matrix. In some embodiments, the first yellow color filter 300a and the second yellow color filter 300b have a thickness "$T_Y$" which is in a range from about 0.8 μm to about 2.0 μm. In some embodiments, the first yellow color filter 300a and the second yellow color filter 300b have a light transmittance rate which is less than about 1% for light with a wavelength of 400 nm to 480 nm. In some embodiments, the first yellow color filter 300a and the second yellow color filter 300b have a light transmittance rate which is greater than about 80% for light with a wavelength of 550 nm or above. In some embodiments, the first yellow color filter 300a and the second yellow color filter 300b have a light transmittance rate which is equal to about 50% for light with a wavelength of 490 nm to 530 nm. The light transmittance rate of the first yellow color filter 300a and the second yellow color filter 300b can be optimized by adjusting the amount of yellow pigment in the polymer matrix. In FIG. 3, the first yellow color filter 300a and the second yellow color filter 300b have polygonal structures. In detail, the first yellow color filter 300a and the second yellow color filter 300b have polygonal structures in a cross-section perpendicular to the substrate 120.

In some embodiments, the red light (e.g. 610 nm-780 nm) emitted by the red light-emitting layer 200 will be mixed with a part of the deep blue (DB) light (e.g. 420 nm-450 nm) emitted by the first light source 180a. However, the part of the deep blue (DB) light will be fully blocked and all of the red light will be allowed to pass through by the first yellow color filter 300a covering the red light-emitting layer 200 due to the first yellow color filter 300a having specific optical properties, wherein its light transmittance rate is less than about 1% for light with a wavelength of 400 nm to 480 nm and its light transmittance rate is greater than about 80% for light with a wavelength of 550 nm or above. Similarly, the green light (e.g. 500 nm-550 nm) emitted by the green light-emitting layer 220 will be mixed with a part of the deep blue (DB) light (e.g. 420 nm-450 nm) emitted by the second light source 180b. Also, the part of the deep blue (DB) light will be fully blocked and most of the green light will be allowed to pass through by the second yellow color filter 300b covering the green light-emitting layer 220 due to the second yellow color filter 300b having specific optical properties, wherein its light transmittance rate is less than about 1% for light with a wavelength of 400 nm to 480 nm and its light transmittance rate is equal to about 50% for light with a wavelength of 490 nm to 530 nm. Therefore, in the first subpixel 160a, unwanted deep-blue-light noise will be fully blocked and pure red light will be emitted therefrom. Also, in the second subpixel 160b, unwanted deep-blue-light noise will be fully blocked and pure green light will be emitted therefrom.

In FIG. 3, the light-emitting device 100 further includes a blue light-emitting layer 240 which covers the third light source 180c. In some embodiments, the blue light-emitting layer 240 includes blue phosphor. Examples of phosphor materials include sulfides, aluminates, oxides, silicates, nitrides, YAG (optionally doped with cerium), and terbium aluminum garnet (TAG)-based materials. The blue light-emitting layer 240 including blue phosphor absorbs the deep blue (DB) emission from the third light source 180c and converts the emission wavelength to blue light.

In FIG. 3, the light-emitting device 100 further includes a first light guiding layer 400a, a second light guiding layer 400b and a third light guiding layer 400c. The first light guiding layer 400a is formed between the first light source 180a and the red light-emitting layer 200. The second light guiding layer 400b is formed between the second light source 180b and the green light-emitting layer 220. The third light guiding layer 400c is formed between the third light source 180c and the blue light-emitting layer 240. In some embodiments, the first light guiding layer 400a, the second light guiding layer 400b and the third light guiding layer 400c are formed of a variety of transparent materials such as epoxy, silicone or acrylic.

In some embodiments, the first light source 180a constitutes a first micro LED device 420a. The second light source 180b constitutes a second micro LED device 420b. The third light source 180c constitutes a third micro LED device 420c. In some embodiments, each of the first micro LED device 420a, the second micro LED device 420b and the third micro LED device 420c has a width "$W_{LED}$" which is in a range from about 1 μm to about 100 μm.

Figure 4:
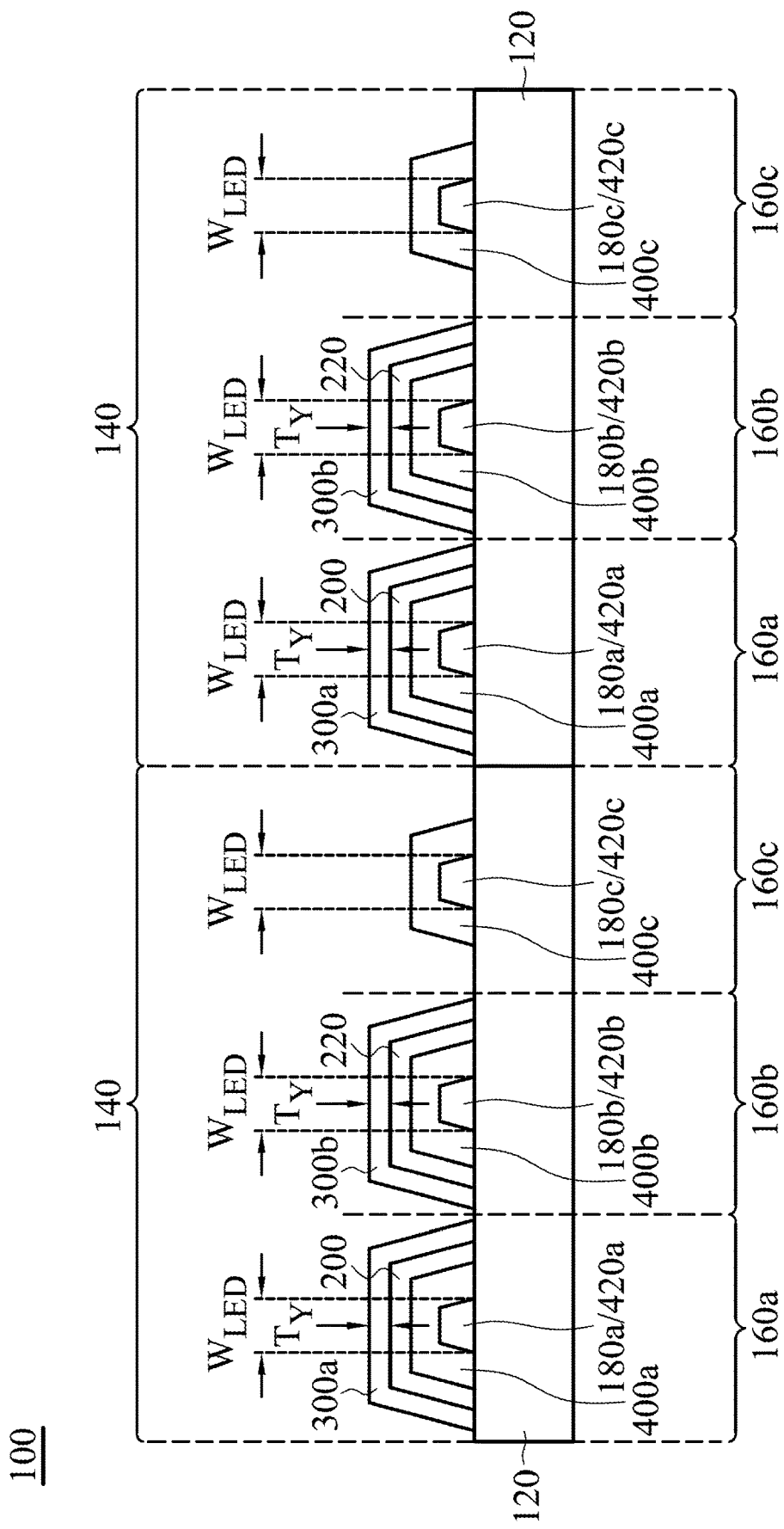
FIG. 4 is a cross-sectional view of a light-emitting device in accordance with one embodiment of the invention.

Referring to FIG. 4, in accordance with one embodiment of the invention, a light-emitting device 100 is provided. FIG. 4 shows a cross-sectional view of the light-emitting device 100.

The light-emitting device 100 includes a substrate 120 including a plurality of pixels 140, each pixel 140 including a plurality of subpixels (160a, 160b and 160c) designed to emit light with different colors. The plurality of subpixels (160a, 160b and 160c) includes a first subpixel 160a designed to emit red light (R), a second subpixel 160b designed to emit green light (G), and a third subpixel 160c designed to emit blue light (B). The first subpixel 160a includes a first light source 180a, a red light-emitting layer 200 and a first yellow color filter 300a. The first light source 180a is formed on the substrate 120. The red light-emitting layer 200 covers the first light source 180a. The first yellow color filter 300a covers the red light-emitting layer 200. The second subpixel 160b includes a second light source 180b, a green light-emitting layer 220 and a second yellow color filter 300b. The second light source 180b is formed on the substrate 120. The green light-emitting layer 220 covers the second light source 180b. The second yellow color filter 300b covers the green light-emitting layer 220. The third subpixel 160c includes a third light source 180c formed on the substrate 120.

In FIG. 4, each of the first light source 180a, the second light source 180b and the third light source 180c emits blue (B) light (e.g. 450 nm-485 nm). In some embodiments, the red light-emitting layer 200 includes red phosphor. In some embodiments, the green light-emitting layer 220 includes green phosphor. Examples of phosphor materials include sulfides, aluminates, oxides, silicates, nitrides, YAG (optionally doped with cerium), and terbium aluminum garnet (TAG)-based materials. The red light-emitting layer 200 including red phosphor absorbs the blue (B) emission from the first light source 180a and converts the emission wavelength to red light. The green light-emitting layer 220 including green phosphor absorbs the blue (B) emission from the second light source 180b and converts the emission wavelength to green light.

In some embodiments, the first yellow color filter 300a and the second yellow color filter 300b include yellow pigments blended in a polymer matrix. In some embodiments, the first yellow color filter 300a and the second yellow color filter 300b have a thickness "$T_Y$" which is in a range from about 0.8 μm to about 2.0 μm. In some embodiments, the first yellow color filter 300a and the second yellow color filter 300b have a light transmittance rate which is less than about 1% for light with a wavelength of 400 nm to 480 nm. In some embodiments, the first yellow color filter 300a and the second yellow color filter 300b have a light transmittance rate which is greater than about 80% for light with a wavelength of 550 nm or above. In some embodiments, the first yellow color filter 300a and the second yellow color filter 300b have a light transmittance rate which is equal to about 50% for light with a wavelength of 490 nm to 530 nm. The light transmittance rate of the first yellow color filter 300a and the second yellow color filter 300b can be optimized by adjusting the amount of yellow pigment in the polymer matrix. In FIG. 4, the first yellow color filter 300a and the second yellow color filter 300b have polygonal structures. In detail, the first yellow color filter 300a and the second yellow color filter 300b have polygonal structures in a cross-section perpendicular to the substrate 120.

In some embodiments, the red light (e.g. 610 nm-780 nm) emitted by the red light-emitting layer 200 will be mixed with a part of the blue (B) light (e.g. 450 nm-485 nm) emitted by the first light source 180a. However, the part of the blue (B) light will be fully blocked and all of the red light will be allowed to pass through by the first yellow color filter 300a covering the red light-emitting layer 200 due to the first yellow color filter 300a having specific optical properties, wherein its light transmittance rate is less than about 1% for light with a wavelength of 400 nm to 480 nm and its light transmittance rate is greater than about 80% for light with a wavelength of 550 nm or above. Similarly, the green light (e.g. 500 nm-550 nm) emitted by the green light-emitting layer 220 will be mixed with a part of the blue (B) light (e.g. 450 nm-485 nm) emitted by the second light source 180b. Also, the part of the blue (B) light will be fully blocked and most of the green light will be allowed to pass through by the second yellow color filter 300b covering the green light-emitting layer 220 due to the second yellow color filter 300b having specific optical properties, wherein its light transmittance rate is less than about 1% for light with a wavelength of 400 nm to 480 nm and its light transmittance rate is equal to about 50% for light with a wavelength of 490 nm to 530 nm. Therefore, in the first subpixel 160a, unwanted blue-light noise will be fully blocked and pure red light will be emitted therefrom. Also, in the second subpixel 160b, unwanted blue-light noise will be fully blocked and pure green light will be emitted therefrom.

In FIG. 4, the light-emitting device 100 further includes a first light guiding layer 400a, a second light guiding layer 400b and a third light guiding layer 400c. The first light guiding layer 400a is formed between the first light source 180a and the red light-emitting layer 200. The second light guiding layer 400b is formed between the second light source 180b and the green light-emitting layer 220. The third light guiding layer 400c covers the third light source 180c. In some embodiments, the first light guiding layer 400a, the second light guiding layer 400b and the third light guiding layer 400c are formed of a variety of transparent materials such as epoxy, silicone or acrylic.

In some embodiments, the first light source 180a constitutes a first micro LED device 420a. The second light source 180b constitutes a second micro LED device 420b. The third light source 180c constitutes a third micro LED device 420c. In some embodiments, each of the first micro LED device 420a, the second micro LED device 420b and the third micro LED device 420c has a width "$W_{LED}$" which is in a range from about 1 μm to about 100 μm.

Figure 5A:
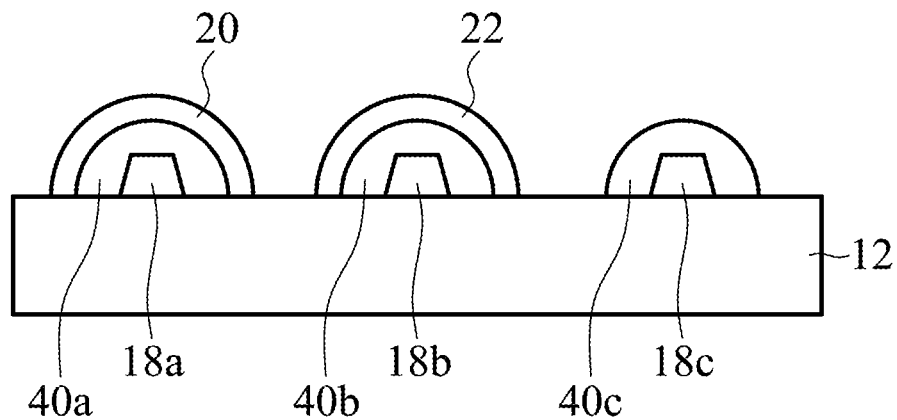
FIGS. 5A-5C are cross-sectional views of a method for fabricating a light-emitting device in accordance with one embodiment of the invention.
Figure 5B:
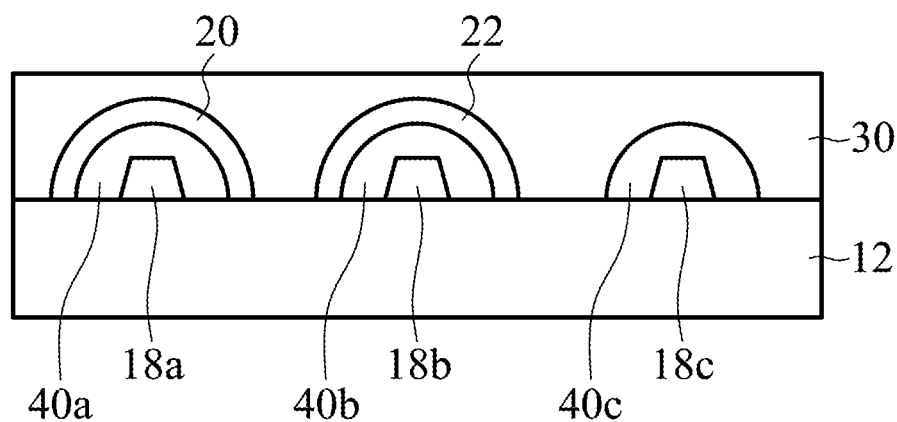
Figure 5C:
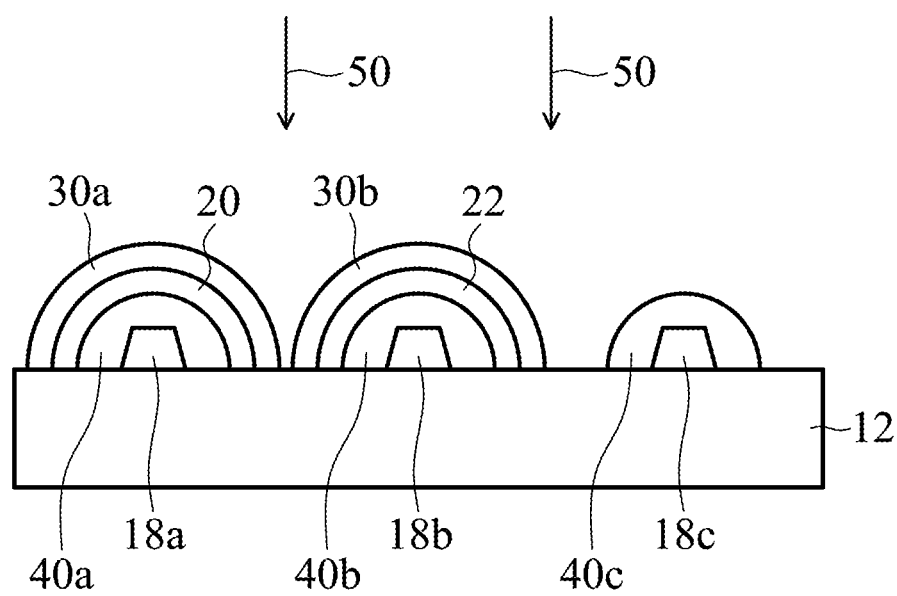

Referring to FIGS. 5A-5C, in accordance with one embodiment of the invention, a method for fabricating a light-emitting device is provided. FIGS. 5A-5C show cross-sectional views of the method for fabricating a light-emitting device.

Referring to FIG. 5A, a substrate 12 with a first light source 18a, a second light source 18b and a third light source 18c mounted thereon is provided. The second light source 18b is located between the first light source 18a and the third light source 18c. The first light source 18a is covered by a red light-emitting layer 20. The second light source 18b is covered by a green light-emitting layer 22.

Referring to FIG. 5B, a yellow color filter layer 30 is formed over the substrate 12.

Referring to FIG. 5C, a lithography process 50 is performed on the yellow color filter layer 30 to form a first yellow color filter 30a and a second yellow color filter 30b.

The first yellow color filter 30a covers the red light-emitting layer 20. The second yellow color filter 30b covers the green light-emitting layer 22.

In some embodiments, the step of forming the yellow color filter layer 30 over the substrate 12 is performed by a spin-coating or spray-coating process.

In the present invention, the yellow color filters having specific optical properties disposed to cover the red light-emitting layer and the green light-emitting layer are able to fully block noise of deep-blue light and blue light emitted by the light sources and allow red light and green light to pass through. By disposing the yellow color filters with a specific range of light transmittance rate, the purity of light emitted by the red subpixels and the green subpixels is thus improved. In addition, the yellow color filters comprise curved structures, polygonal structures or other structures with suitable shapes. The specific dimensions of the yellow color filters are also required. For example, the thickness of the yellow color filters is in a range from about 0.8 µm to about 2.0 µm to ensure that the yellow color filters achieve adequate light interception efficiency.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting device, comprising:
    a substrate comprising a plurality of pixels, each pixel comprising a plurality of subpixels designed to emit light with different colors, wherein the plurality of subpixels comprise:
    a first subpixel designed to emit red light, comprising:
        a first light source formed on the substrate;
        a red light-emitting layer covering the first light source; and
        a first yellow color filter covering the red light-emitting layer;
    a second subpixel designed to emit green light, comprising:
        a second light source formed on the substrate;
        a green light-emitting layer covering the second light source; and
        a second yellow color filter covering the green light-emitting layer; and
    a third subpixel designed to emit blue light, comprising:
        a third light source formed on the substrate,
    wherein the first yellow color filter and the second yellow color filter comprise yellow pigments blended in a polymer matrix.

2. The light-emitting device as claimed in claim 1, wherein the first light source, the second light source and the third light source emit deep blue light.

3. The light-emitting device as claimed in claim 2, further comprising a blue light-emitting layer covering the third light source.

4. The light-emitting device as claimed in claim 3, wherein the blue light-emitting layer comprises blue phosphor.

5. The light-emitting device as claimed in claim 3, further comprising a first light guiding layer formed between the first light source and the red light-emitting layer, a second light guiding layer formed between the second light source and the green light-emitting layer, and a third light guiding layer formed between the third light source and the blue light-emitting layer.

6. The light-emitting device as claimed in claim 1, wherein the first light source, the second light source and the third light source emit blue light.

7. The light-emitting device as claimed in claim 6, further comprising a first light guiding layer formed between the first light source and the red light-emitting layer, a second light guiding layer formed between the second light source and the green light-emitting layer, and a third light guiding layer covering the third light source.

8. The light-emitting device as claimed in claim 1, wherein the red light-emitting layer comprises red phosphor.

9. The light-emitting device as claimed in claim 1, wherein the green light-emitting layer comprises green phosphor.

10. The light-emitting device as claimed in claim 1, wherein the first yellow color filter and the second yellow color filter have a thickness which is in a range from 0.8 µm to 2.0 µm.

11. The light-emitting device as claimed in claim 1, wherein the first light source constitutes a first micro LED device, the second light source constitutes a second micro LED device, and the third light source constitutes a third micro LED device.

12. The light-emitting device as claimed in claim 11, wherein each of the first micro LED device, the second micro LED device and the third micro LED device has a width which is in a range from 1 µm to 100 µm.

13. A light emitting device, comprising:
    a substrate comprising a plurality of pixels, each pixel comprising a plurality of subpixels designed to emit light with different colors, wherein the plurality of subpixels comprise:
    a first subpixel designed to emit red light, comprising:
        a first light source formed on the substrate;
        a red light-emitting layer covering the first light source; and
        a first yellow color filter covering the red light-emitting layer;
    a second subpixel designed to emit green light, comprising:
        a second light source formed on the substrate;
        a green light-emitting layer covering the second light source; and
        a second yellow color filter covering the green light-emitting layer; and
    a third subpixel designed to emit blue light, comprising:
        a third light source formed on the substrate,
    wherein the first yellow color filter and the second yellow color filter have a light transmittance rate which is less than 1% for light with a wavelength of 400 nm to 480 nm.

14. A light-emitting device, comprising:
    a substrate comprising a plurality of pixels, each pixel comprising a plurality of subpixels designed to emit light with different colors, wherein the plurality of subpixels comprise:
    a first subpixel designed to emit red light, comprising:
        a first light source formed on the substrate;
        a red light-emitting layer covering the first light source; and
        a first yellow color filter covering the red light-emitting layer;
    a second subpixel designed to emit green light, comprising:

a second light source formed on the substrate;
a green light-emitting layer covering the second light source; and
a second yellow color filter covering the green light-emitting layer; and
a third subpixel designed to emit blue light, comprising:
a third light source formed on the substrate,
wherein the first yellow color filter and the second yellow color filter have a light transmittance rate which is greater than 80% for light with a wavelength of 550 nm or above.

15. A light-emitting device, comprising:
a substrate comprising a plurality of pixels, each pixel comprising a plurality of subpixels designed to emit light with different colors, wherein the plurality of subpixels comprise:
a first subpixel designed to emit red light, comprising:
a first light source formed on the substrate;
a red light-emitting layer covering the first light source; and
a first yellow color filter covering the red light-emitting layer;
a second subpixel designed to emit green light, comprising:
a second light source formed on the substrate;
a green light-emitting layer covering the second light source; and
a second yellow color filter covering the green light-emitting layer; and
a third subpixel designed to emit blue light, comprising:
a third light source formed on the substrate,
wherein the first yellow color filter and the second yellow color filter have a light transmittance rate which is equal to 50% for light with a wavelength of 490 nm to 530 nm.

16. A light-emitting device, comprising:
a substrate comprising a plurality of pixels, each pixel comprising a plurality of subpixels designed to emit light with different colors, wherein the plurality of subpixels comprise:
a first subpixel designed to emit red light, comprising:
a first light source formed on the substrate;
a red light-emitting layer covering the first light source; and
a first yellow color filter covering the red light-emitting layer;
a second subpixel designed to emit green light, comprising:
a second light source formed on the substrate;
a green light-emitting layer covering the second light source; and
a second yellow color filter covering the green light-emitting layer; and
a third subpixel designed to emit blue light, comprising:
a third light source formed on the substrate,
wherein the first yellow color filter and the second yellow color filter have curved structures or polygonal structures in a cross-section perpendicular to the substrate.

* * * * *